(12) United States Patent
Fukumitsu et al.

(10) Patent No.: US 9,236,357 B2
(45) Date of Patent: Jan. 12, 2016

(54) MOUNTING SUBSTRATE AND LIGHT EMITTING DEVICE

(71) Applicant: MURATA MANUFACTURING CO., LTD., Kyoto-fu (JP)

(72) Inventors: Masakazu Fukumitsu, Kyoto-fu (JP); Yoshiharu Yoshii, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/556,404

(22) Filed: Dec. 1, 2014

(65) Prior Publication Data

US 2015/0084090 A1    Mar. 26, 2015

Related U.S. Application Data

(63) Continuation of application No. PCT/JP2013/067177, filed on Jun. 24, 2013.

(30) Foreign Application Priority Data

Jun. 26, 2012 (JP) .................................. 2012-142786

(51) Int. Cl.
*H01L 23/60* (2006.01)
*H01L 33/62* (2010.01)
(Continued)

(52) U.S. Cl.
CPC ................ *H01L 23/60* (2013.01); *H01L 23/12* (2013.01); *H01L 23/48* (2013.01); *H01L 33/62* (2013.01);
(Continued)

(58) Field of Classification Search
CPC ....... H01L 23/486; H01L 33/62; H01L 23/60; H01L 23/12; H05F 3/00; H05K 3/421; H05K 1/0306; H05K 1/0259

IPC ....................................................... H01L 23/60
See application file for complete search history.

(56) References Cited

U.S. PATENT DOCUMENTS

| | | | | |
|---|---|---|---|---|
| 8,970,006 B2 * | 3/2015 | Renna | ........................... | 257/620 |
| 2011/0170303 A1 * | 7/2011 | Wu et al. | ........................ | 362/382 |
| 2013/0026650 A1 * | 1/2013 | Yamagata | ............... | H01L 24/24 |
| | | | | 257/774 |

FOREIGN PATENT DOCUMENTS

| | | | |
|---|---|---|---|
| JP | H11-251644 A | | 9/1999 |
| JP | 2005-166909 A | | 6/2005 |

(Continued)

OTHER PUBLICATIONS

International Search Report; PCT/JP2013/067177; Jul. 16, 2013.
(Continued)

*Primary Examiner* — William Coleman
(74) *Attorney, Agent, or Firm* — Studebaker & Brackett PC

(57) ABSTRACT

External connection conductors are arranged on a back surface of a base material, and wiring conductors are arranged on a front surface. An insulating layer is provided on surfaces of the wiring conductors. Component mounting conductors are provided on a surface of the insulating layer. The component mounting conductor and the wiring conductor are electrically coupled to each other, and the component mounting conductor and the wiring conductor are electrically coupled to each other. The wiring conductor and the external connection conductor are electrically coupled by a conductor film on an inner wall surface of a hole provided between forming areas of the component mounting conductors. The wiring conductor and the external connection conductor are electrically coupled by a conductor film on an inner wall surface of a hole provided between the forming areas of the component mounting conductors.

7 Claims, 14 Drawing Sheets

(51) Int. Cl.
*H05K 3/42* (2006.01)
*H01L 23/12* (2006.01)
*H01L 23/48* (2006.01)
*H05F 3/00* (2006.01)
*H01L 33/48* (2010.01)
*H05K 1/02* (2006.01)
*H05K 1/03* (2006.01)
*H05K 1/11* (2006.01)

(52) U.S. Cl.
CPC ............... *H05F 3/00* (2013.01); *H05K 3/421* (2013.01); *H01L 33/486* (2013.01); *H01L 2924/0002* (2013.01); *H05K 1/0259* (2013.01); *H05K 1/0306* (2013.01); *H05K 1/113* (2013.01); *H05K 2201/10106* (2013.01)

(56) References Cited

FOREIGN PATENT DOCUMENTS

| JP | 2006-041410 A | 2/2006 |
| JP | 2008-227433 A | 9/2008 |
| JP | 2008-270327 A | 11/2008 |
| JP | 2011-176234 A | 9/2011 |

OTHER PUBLICATIONS

Written Opinion of the International Searching Authority; PCT/JP2013/067177; Jul. 16, 2013.

* cited by examiner

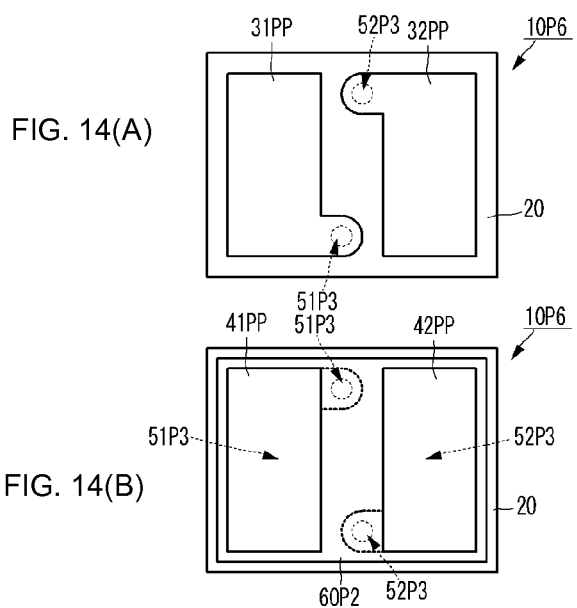

MOUNTING SUBSTRATE AND LIGHT EMITTING DEVICE

CROSS REFERENCE TO RELATED APPLICATIONS

This application claims benefit of priority to Japanese Patent Application No. 2012-142786 filed Jun. 26, 2012, and to International Patent Application No. PCT/JP2013/067177 filed Jun. 24, 2013, the entire content of each of which is incorporated herein by reference.

TECHNICAL FIELD

The present technical field relates to a mounting substrate to be put between an electronic component, such as an LED, and a circuit board, such as a motherboard, when the electronic component is mounted on the circuit board, and to a light emitting device including the mounting substrate.

BACKGROUND

LED illumination using a light emitting diode (LED) has become popular now because it offers power saving and long life.

An LED element has low electrostatic resistance. Hence, when the LED element is simply and directly mounted on a motherboard, it is highly likely to be broken by direct influence of static electricity resulting from the motherboard or static electricity applied from the outside via the motherboard. To avoid this, it is conceivable to connect an electrostatic protection element to the LED element. However, when the LED element is directly mounted on the motherboard, the electrostatic protection element also needs to be mounted near the LED element. This increases the total mounting area, and miniaturization is not achieved.

Accordingly, for example, Japanese Unexamined Patent Application Publication No. 11-251644 and Japanese Unexamined Patent Application Publication No. 2008-270327 describe a structure in which an LED element is mounted on a motherboard with a mounting substrate, including a base material of silicon single crystal or a ceramic material, being disposed therebetween. There is a method for providing the mounting substrate with the function of the above-described electrostatic protection element.

Such a mounting substrate is shaped like a flat plate. An LED element is mounted on a front side of the mounting substrate, and a back side of the mounting substrate is mounted on a motherboard. For this reason, component mounting conductors are provided on a front surface of the base material of the mounting substrate, and external connection conductors are provided on a back surface of the base material. To ensure continuity between the component mounting conductors and the external connection conductors, connection conductors are provided to penetrate the base material.

For example, FIGS. 9(A), 9(B), and 9(C) show a front view, a sectional side view, and a back view of an example of a mounting substrate of the related art.

A mounting substrate 10P1 includes a base material 20 shaped like a flat plate. On a front surface of the base material 20, component mounting conductors 31 and 32 are provided. On a back surface of the base material 20, external connection conductors 41 and 42 are provided. The component mounting conductor 31 and the external connection conductor 41 are provided to be superposed on each other when the base material 20 is viewed in plan. The component mounting conductor 32 and the external connection conductor 42 are provided to be superposed on each other when the base material 20 is viewed in plan. The component mounting conductor 31 and the external connection conductor 41 are coupled by a conductive via 51P1 penetrating the base material 20 in the thickness direction. The component mounting conductor 32 and the external connection conductor 42 are coupled by a conductive via 52P1 penetrating the base material 20 in the thickness direction.

The conductive vias 51P1 and 52P1 are filled with a conductive material. When conductive vias 51P1 and 52P1 are used, they need to have a small diameter to prevent the substrate from being broken by thermal stress of the conductive material.

However, the difficulty in filling the conductive material increases as the diameter decreases. Hence, it takes much time to fill the conductive material.

For this reason, for example, structures using through holes illustrated in FIGS. 10(A) through 10(C) and 11(A) through 11(C) have been hitherto used. FIGS. 10(A), 10(B), and 10(C) and FIGS. 11(A), 11(B), and 11(C) each show a front view, a sectional side view, and a back view of a different example of a mounting substrate of the related art.

In a mounting substrate 10P2 illustrated in FIGS. 10(A), 10(B), and 10(C), the conductive vias 51P1 and 52P1 of the mounting substrate 10P1 are replaced by conductive through holes 51P2 and 52P2. Other structures are the same.

The conductive through holes 51P2 and 52P2 include holes 511P2 and 521P2 having a certain diameter, respectively. The hole 511P2 penetrates a component mounting conductor 31, a base material 20, and an external connection conductor 41. The hole 521P2 penetrates a component mounting conductor 32, the base material 20, and an external connection conductor 42. A conductor film 512P2 is provided on an inner wall surface of the hole 511P2. A conductor film 522P2 is provided on an inner wall surface of the hole 521P2.

In a mounting substrate 10P3 illustrated in FIGS. 11(A), 11(B), and 11(C), structures of conductive holes 51P3 and 52P3 are different from those of the conductive through holes 51P2 and 52P2 of the mounting substrate 10P2. Other structures are the same.

The conductive holes 51P3 and 52P3 include holes 511P3 and 521P3 having a certain diameter, respectively. The hole 511P3 penetrates an external connection conductor 41 and a base material 20, and reaches a surface of a component mounting conductor 31 on the base material 20. The hole 521P3 penetrates an external connection conductor 42 and the base material 20, and reaches a surface of a component mounting conductor 32 on the base material 20.

A conductor film 512P3 is provided on an inner wall surface of the hole 511P3. The conductor film 512P3 is provided not only on the inner wall surface of the hole 511P3 in the base material 20, but also on the inner wall surface of the hole 511P3 at the component mounting conductor 31. A conductor film 522P3 is provided on an inner wall surface of the hole 521P3. The conductor film 522P3 is provided not only on the inner wall surface of the hole 521P3 in the base material 20, but also on the inner wall surface of the hole 521P3 at the component mounting conductor 32.

SUMMARY

Technical Problem

However, the above-described structures illustrated in FIGS. 10(A), 10(B), and 10(C) and 11(A), 11(B), and 11(C), that is, the mounting substrate using the conductive through holes or the conductive holes has the following problems.

FIG. 12 is a side view illustrating a mounting manner using the mounting substrate 10P3 of (FIGS. 11(A), 11(B), and 11(C).

A conductor 911 of an LED element 910 is mounted on the component mounting conductor 31 of the mounting substrate 10P3 with solder 993 being disposed therebetween. A conductor 912 of the LED element 910 is mounted on the component mounting conductor 32 of the mounting substrate 10P3 with solder 994 being disposed therebetween.

The external connection conductor 41 of the mounting substrate 10P3 is mounted on a land 901 of an external circuit board 900 with solder 991 being disposed therebetween. The external connection conductor 42 of the mounting substrate 10P3 is mounted on a land 902 of the external circuit board 900 with solder 992 being disposed therebetween.

When the mounting substrate 10P3 is mounted on the external circuit board 900 in this mounting manner, the solder 991 enters the hole 511P3 of the conductive hole 51P3. However, it is not easy to completely fill the entire inside of the hole 511P3 with the solder 991. For this reason, an aperture of the conductive hole 51P3 on the external connection conductor 41 is closed, and a void is likely to be formed within the conductive hole 51P3.

Similarly, the solder 992 enters the hole 521P3 of the conductive hole 52P3. However, it is not easy to completely fill the entire inside of the hole 521P3 with the solder 992. For this reason, an aperture of the conductive hole 52P3 on the external connection conductor 42 is closed, and a void is likely to be formed within the conductive hole 52P3.

When such voids are formed, the conductor films 512P3 and 522P3 are sometimes broken by thermal expansion of the voids. This reduces reliability.

Such a problem of voids similarly occurs when the conductive through holes 51P2 and 52P2 of FIGS. 10(A), 10(B), and 10(C) are used.

To avoid this problem of voids, it is only necessary to adopt a structure in which apertures are closed. For example, structures illustrated in FIGS. 13(A), 13(B), and 13(C) and 14(A) and 14(B) are conceivable.

FIGS. 13(A) and 13(B) are a front view and a back view, respectively, of a mounting substrate 10P4 in which apertures are closed. FIG. 13(C) is a back view of a mounting substrate 10P5 in which apertures are closed.

The mounting substrate 10P4 illustrated in FIGS. 13(A) and 13(B) includes an insulating layer 60P on a surface of a base material 20 on external connection conductors 41 and 42. The insulating layer 60P is provided to cover apertures of conductive holes 51P3 and 52P3. In this structure, the external connection conductors 41 and 42 are partly covered with the insulating layer 60P. For this reason, conductivity and connection strength are reduced.

In the mounting substrate 10P5 illustrated in FIG. 13(C), the areas of external connection conductors 41P and 42P are larger than in the mounting substrate 10P4 of FIGS. 13(A) and 13(B). In this structure, however, since the areas of the external connection conductors 41P and 42P are increased, the area of a base material 20P also needs to be increased. This increases the size.

FIGS. 14(A) and 14(B) are a front view and a back view, respectively, of a mounting substrate 10P6 in which apertures are closed.

In the mounting substrate 10P6 illustrated in FIGS. 14(A) and 14(B), conductive holes 51P3 and 52P3 are provided between component mounting conductors 31PP and 32PP (between external connection conductors 41PP and 42PP), in contrast to the mounting substrate 10P3 of FIGS. 11(A), 11(B), and 11(C). Apertures of the conductive holes 51P3 and 52P3 on the side of external connection conductors 41PP and 42PP are closed by an insulating layer 60P2.

In such a structure, the above-described occurrence of voids is avoided, but the component mounting conductors 31PP and 32PP project in a direction to approach each other. For this reason, the component mounting conductors 31PP and 32PP are close to each other, and a short circuit between the component mounting conductors 31PP and 32PP is likely to be caused by a solder bridge during solder mounting. This reduces reliability.

An object of the present disclosure is to provide a compact mounting substrate without reducing reliability.

Solution to Problem

A mounting substrate according to the present disclosure is characterized in having the following structure. The mounting substrate includes a base material shaped like a flat plate, first and second component mounting conductors, first and second external connection conductors, first and second wiring conductors, an insulating layer, and first and second conductive holes. The base material has a first surface and a second surface intersecting a thickness direction at right angles. The first and second component mounting conductors are provided at a distance from each other on the first surface of the base material. The first and second external connection conductors are provided at a distance from each other on the second surface of the base material. The first wiring conductor is disposed between the first surface of the base material and the first component mounting conductor, and is shaped such as to be in contact with the first component mounting conductor and such as not to be in contact with the second component mounting conductor. The second wiring conductor is disposed between the first surface and the second component mounting conductor, and is shaped such as to be in contact with the second component mounting conductor and such as not to be in contact with the first component mounting conductor. The insulating layer is disposed between the first and second wiring conductors and the first and second component mounting conductors, and is shaped such that center areas of the first and second wiring conductors are exposed therefrom. The first conductive hole is shaped such as to be open at one end between the first component mounting conductor and the second component mounting conductor on the first surface of the base material and such as to be in contact at the other end with the first external connection electrode. The second conductive hole is shaped such as to be open at one end between the first component mounting conductor and the second component mounting conductor on the first surface of the base material and such as to be in contact at the other end with the second external connection electrode. The first wiring conductor and the second wiring conductor partly project as projecting portions in a direction to approach each other. The first conductive hole penetrates the projecting portion of the first wiring conductor, and the second conductive hole penetrates the projecting portion of the second wiring conductor.

In this structure, an aperture is not provided in forming areas of the component mounting conductors and forming areas of the external connection conductors, when the mounting substrate is viewed in plan. Therefore, a void is not formed by solder during mounting. Further, the mounting area does not decrease even when the shapes of the first and second external connection conductors and the first and second component mounting conductors are not enlarged. Still further, the first component mounting conductor and the second component mounting conductor are not close to each other, and a proper distance can be maintained therebetween. Thus, the occurrence of a solder bridge can be suppressed when an electronic component is mounted using the component mounting conductors.

The mounting substrate of the present disclosure may have the following structure. The mounting substrate includes a base material shaped like a flat plate, first and second wiring conductors, first and second external connection conductors, an insulating layer from which center areas of the first and second wiring conductors are exposed, a first conductive hole, and a second conductive hole. The base material shaped like the flat plate has a first surface and a second surface opposed to the first surface. The first and second wiring conductors are provided at a distance from each other on the first surface of the base material. The first and second external connection conductors are provided at a distance from each other on the second surface of the base material. The insulating layer from which the center areas of the first and second wiring conductors are exposed is disposed on a side of the first and second wiring conductors opposite from the base material. The first conductive hole is open at one end between the first wiring conductor and the second wiring conductor on the first surface of the base material, and is in contact at the other end with the first external connection electrode. The second conductive hole is open at one end between the first wiring conductor and the second wiring conductor on the first surface of the base material, and is in contact at the other end with the second external connection electrode.

Apertures at the open one ends of the first conductive hole and the second conductive hole are covered with the insulating layer. The first wiring conductor and the second wiring conductor partly project as projecting portions in a direction to approach each other. The first conductive hole penetrates the projecting portion of the first wiring conductor. The second conductive hole penetrates the projecting portion of the second wiring conductor.

That is, in the mounting substrate of this disclosure, the first wiring conductor also functions as a first component mounting conductor, and the second wiring conductor also functions as a second component mounting conductor. In this structure, the number of constituent members of the mounting substrate can be reduced, and the thickness and cost can be reduced.

The mounting substrate of the present disclosure may have the following structure. The mounting substrate includes a base material, first and second component mounting conductors, first and second external connection conductors, first and second wiring conductors, an insulating layer, and first and second conductive holes. The base material is shaped like a flat plate having a first surface and a second surface opposed to the first surface, and has an insulating property.

The first and second component mounting conductors are provided at a distance from each other on the first surface of the base material.

The first and second external connection conductors are provided at a distance from each other on the second surface of the base material.

The first wiring conductor is disposed between the second surface of the base material and the first external connection conductor, and is shaped such as to be in contact with the first external connection conductor and such as not to be in contact with the second external connection conductor.

The second wiring conductor is disposed between the second surface and the second external connection conductor, and is shaped such as to be in contact with the second external connection conductor and such as not to be in contact with the first external connection conductor.

The insulating layer is disposed between the first and second wiring conductors and the first and second external connection conductors, and is shaped such that center areas of the first and second wiring conductors are exposed therefrom.

The first conductive hole is shaped such as to be open at one end between the first external connection conductor and the second external connection conductor on the second surface of the base material and such as to be in contact at the other end with the first component mounting electrode.

The second conductive hole is shaped such as to be open at one end between the first external connection conductor and the second external connection conductor on the second surface of the base material and such as to be in contact at the other end with the second component mounting electrode.

The first wiring conductor and the second wiring conductor partly project as projecting portions in a direction to approach each other. The first conductive hole penetrates the projecting portion of the first wiring conductor, and the second conductive hole penetrates the projecting portion of the second wiring conductor.

In this structure, an aperture is not provided in forming areas of the component mounting conductors and forming areas of the external connection conductors, when the mounting substrate is viewed in plan. Therefore, a void is not formed by solder during mounting. Further, the mounting area does not decrease even when the shapes of the first and second external connection conductors and the first and second component mounting conductors are not enlarged. Still further, the first component mounting conductor and the second component mounting conductor are not close to each other, and a proper distance can be maintained therebetween. Thus, the occurrence of a solder bridge can be suppressed when an electronic component is mounted using the component mounting conductors.

The mounting substrate of the present disclosure may have the following structure. The mounting substrate includes a base material shaped like a flat plate, first and second external connection conductors, first and second wiring conductors, an insulating layer from which center areas of the first and second wiring conductors are exposed, a first conductive hole, and a second conductive hole. The base material shaped like the flat plate has a first surface and a second surface opposed to the first surface. The first and second external connection conductors are provided at a distance from each other on the first surface of the base material. The first and second wiring conductors are provided at a distance from each other on the second surface of the base material. The insulating layer from which the center areas of the first and second wiring conductors are exposed is disposed on a side of the first and second wiring conductors opposite from the base material. The first conductive hole is open at one end between the first wiring conductor and the second wiring conductor on the second surface of the base material, and is in contact at the other end with the first external connection electrode. The second conductive hole is open at one end between the first wiring conductor and the second wiring conductor on the second surface of the base material, and is in contact at the other end with the second external connection electrode.

Apertures at the open one ends of the first conductive hole and the second conductive hole are covered with the insulating layer. The first wiring conductor and the second wiring conductor partly project as projecting portions in a direction to approach each other. The first conductive hole penetrates the projecting portion of the first wiring conductor. The second conductive hole penetrates the projecting portion of the second wiring conductor.

That is, in the mounting structure of this disclosure, the first wiring conductor also functions as a first external connection conductor, and the second wiring conductor also functions as a second external connection conductor. In this structure, the number of constituent members of the mounting substrate can be reduced, and the thickness and cost can be reduced.

In the mounting substrate of the present disclosure, the first wiring conductor and the second wiring conductor preferably have electrostatic discharging terminal conductors disposed at a predetermined distance from each other.

In this structure, the first wiring conductor and the second wiring conductor can realize an ESD protecting function.

The base material in the mounting substrate of the present disclosure is formed of silicon single crystal. In this structure, the specific material of the base material is given. The structure of the present disclosure more effectively operates in such a case in which silicon single crystal is used.

The present disclosure also relates to a light emitting device. The light emitting device includes any of the above-described mounting substrates, and a light emitting element mounted on the mounting substrate.

In this structure, a highly reliable light emitting device can be realized by using the above-described mounting substrate.

Advantageous Effects of Disclosure

According to the present disclosure, a highly reliable and compact mounting substrate can be realized.

BRIEF DESCRIPTION OF THE DRAWINGS

FIGS. 14(A) and 14(B) include a front view and a back view of a mounting substrate 10P6 structured such that apertures are closed.

DETAILED DESCRIPTION

Figure 1:
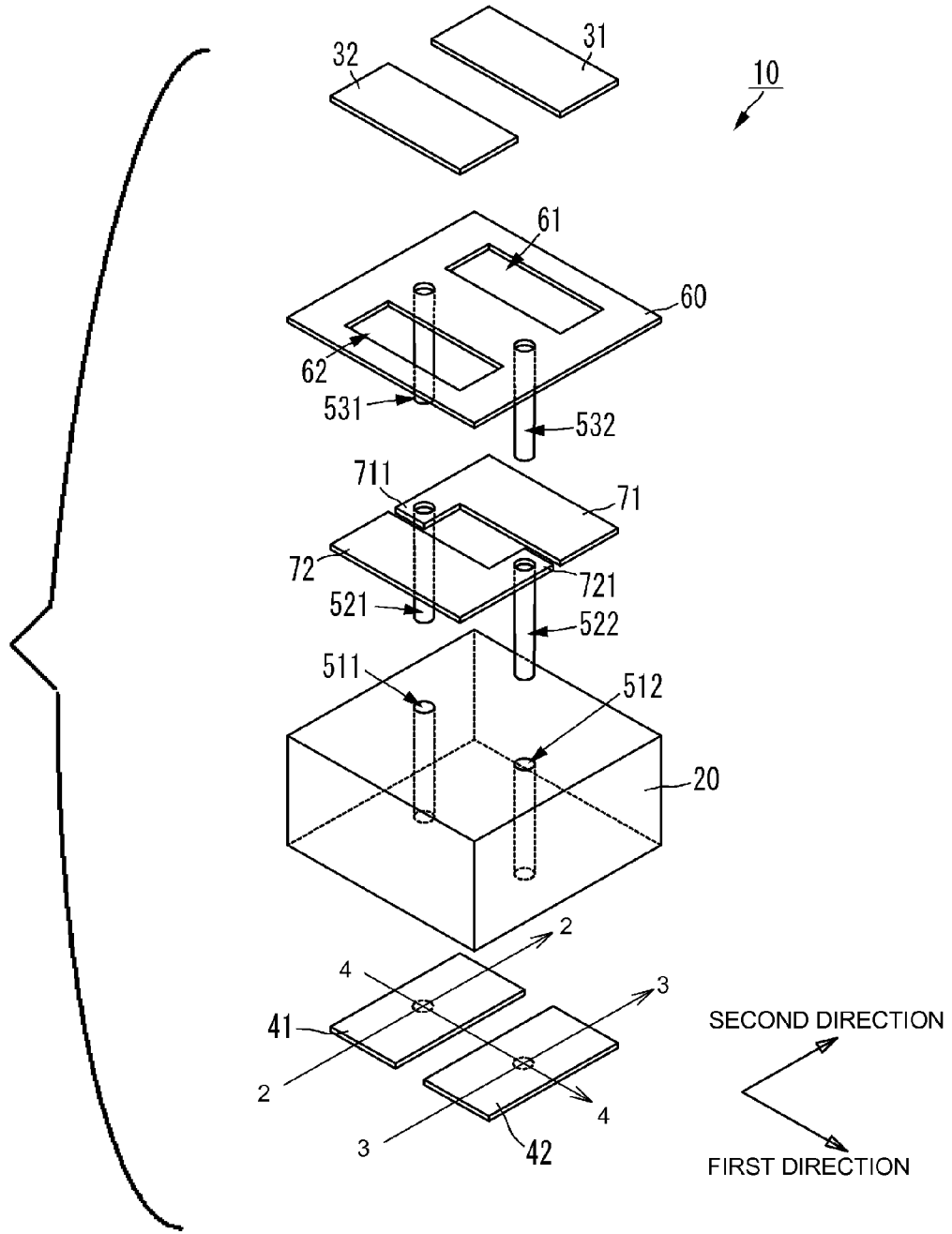
FIG. 1 is an exploded perspective view of a mounting substrate according to a first embodiment of the present disclosure.
Figure 2A:
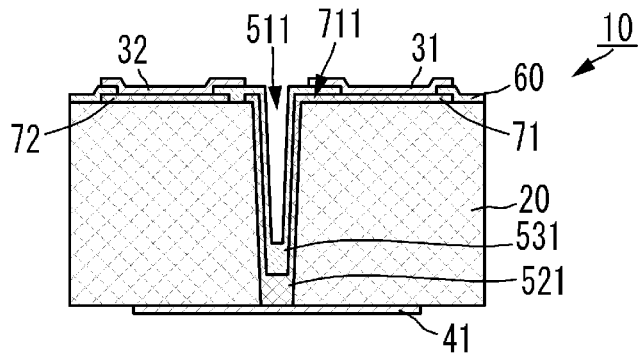
FIGS. 2(A), 2(B), and 2(C) include cross-sectional views of the mounting substrate according to the first embodiment of the present disclosure.
Figure 2B:
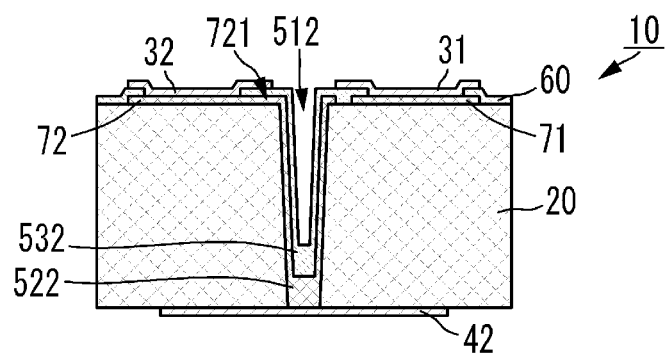
Figure 2C:
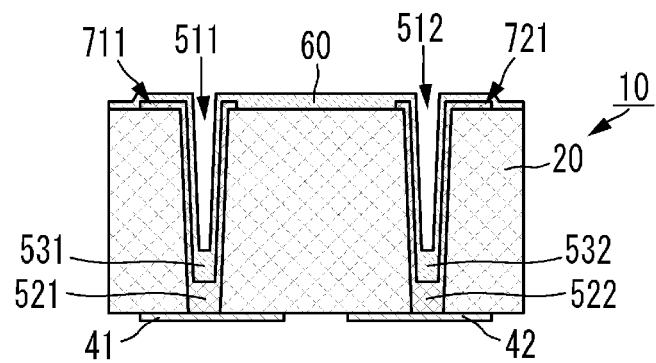

A mounting substrate according to a first embodiment of the present disclosure will be described with reference to the drawings. FIG. 1 is an exploded perspective view of the mounting substrate according to the first embodiment of the present disclosure. FIGS. 2(A), 2(B), and 2(C) include cross-sectional views of the mounting substrate according to the first embodiment of the present disclosure. The cross-sectional views of FIGS. 2(A), 2(B) and 2(C) show a cross section 2-2, a cross section 3-3, and a cross section 4-4, respectively as illustrated in FIG. 1.

A mounting substrate 10 includes a base material 20. The base material 20 is shaped like a rectangular parallelepiped having a front surface (first surface) and a back surface (second surface) intersecting the thickness direction at right angles, and has side surfaces extending in a first direction and side surfaces extending in a second direction. The base material 20 is formed of an insulating semiconductor such as silicon single crystal. The base material 20 does not always need to have an insulating property, and may be a base material formed of a semiconductor.

On the back surface of the base material 20, an external connection conductor 41 (corresponding to a first external connection conductor) and an external connection conductor 42 (corresponding to a second external connection conductor) are provided. The external connection conductors 41 and 42 are arranged in the first direction at a predetermined distance from each other. In plan view, the external connection conductors 41 and 42 are each shaped like a rectangle that is long in the second direction and is short in the first direction. The shape of the external connection conductors 41 and 42 is not limited thereto.

On the front surface of the base material 20, a wiring conductor 71 (corresponding to a first wiring conductor) and a wiring conductor 72 (corresponding to a second wiring conductor) are provided. The wiring conductors 71 and 72 are substantially rectangular, and are arranged in the second direction at a predetermined distance from each other.

The wiring conductor 71 partly projects as a projecting portion 711 toward the wiring conductor 72. The wiring conductor 72 partly projects as a projecting portion 721 toward the wiring conductor 71. The projecting portion 711 and the projecting portion 721 are arranged in the first direction at a predetermined distance from each other. The projecting portion 711 is disposed to be superposed on the external connection conductor 41 when the base material 20 is viewed in plan. The projecting portion 721 is disposed to be superposed on the external connection conductor 42 when the base material 20 is viewed in plan.

An insulating layer 60 is provided on surfaces of the wiring conductors 71 and 72 opposite from the base material 20 (surfaces on the front side of the mounting substrate 10).

The insulating layer 60 is shaped to cover the entire front surface of the base material 20. The insulating layer 60 is shaped to cover at least the projecting portions 711 and 721 of the wiring conductors 71 and 72, and is also shaped to cover a proximity portion between the projecting portion 711 and the wiring conductor 72 and a proximity portion between the projecting portion 721 and the wiring conductor 71. The insulating layer 60 has an aperture 61 in an area corresponding to a center area of the wiring conductor 71, and an aperture 62 in an area corresponding to a center area of the wiring conductor 72.

On a surface of the insulating layer 60 opposite from the base material 20 and the wiring conductors 71 and 72 (surface on the front side of the mounting substrate 10), a component mounting conductor 31 (first component mounting conductor) and a component mounting conductor 32 (second component mounting conductor) are provided.

The component mounting conductors 31 and 32 are arranged in the second direction at a predetermined distance from each other. That is, when the mounting substrate 10 is viewed in plan, the component mounting conductors 31 and 32 are arranged in a direction orthogonal to the arrangement direction of the external connection conductors 41 and 42. In plan view, the component mounting conductors 31 and 32 are each shaped like a rectangle that is long in the first direction and short in the second direction. The shape of the component mounting conductors 31 and 32 is not limited thereto.

The component mounting conductor 31 is in contact with the wiring conductor 71 with the aperture 61 of the insulating layer 60 being therebetween. The component mounting conductor 32 is in contact with the wiring conductor 72 with the aperture 62 of the insulating layer 60 being therebetween.

Such a configuration forms a structure in which the component mounting conductors 31 and 32 are provided on the front side of the base material 20 and the external connection conductors 41 and 42 are provided on the back side of the base material 20.

A hole 511 is provided in the base material 20, the wiring conductor 71, and the insulating layer 60 and in a forming area of the projecting portion 711 of the wiring conductor 71. The hole 511 is shaped to penetrate the base material 20, the wiring conductor 71, and the insulating layer 60 in the thickness direction.

A conductor film 521 is provided on an inner wall surface of the hole 511. The conductor film 521 is provided not only on the inner wall surface of the hole 511 provided in the base material 20, but also on a surface where the hole 511 is in contact with the external connection conductor 41. By this structure, the conductor film 521 is connected to the external connection conductor 41. The conductor film 521 is also connected to the projecting portion 711 of the wiring conductor 71.

An insulating film 531 is provided on a front surface of the conductor film 521, that is, on a surface opposite from a surface in contact with the base material 20 and the external connection conductor 41. The insulating film 531 is physically connected to the insulating layer 60.

A hole 512 is provided in the base material 20, the wiring conductor 72, and the insulating layer 60 and in a forming area of the projecting portion 721 of the wiring conductor 72. The hole 512 is shaped to penetrate the base material 20, the wiring conductor 72, and the insulating layer 60 in the thickness direction.

A conductor film 522 is provided on an inner wall surface of the hole 512. The conductor film 522 is provided not only on the inner wall surface of the hole 512 provided in the base material 20, but also on a surface where the hole 512 is in contact with the external connection conductor 42. By this structure, the conductor film 522 is connected to the external connection conductor 42. The conductor film 522 is also connected to the projecting portion 721 of the wiring conductor 72.

An insulating film 532 is provided on a front surface of the conductor film 522, that is, a surface opposite from a surface in contact with the base material 20 and the external connection conductor 42. The insulating film 532 is physically connected to the insulating layer 60.

With the above-described structure, the component mounting conductor 31 is electrically coupled to the external connection conductor 41 via the wiring conductor 71, the projecting portion 711 of the wiring conductor 71, and the conductor film 521 of the hole 511. Similarly, the component mounting conductor 32 is electrically coupled to the external connection conductor 42 via the wiring conductor 72, the projecting portion 721 of the wiring conductor 72, and the conductor film 522 of the hole 512.

In the above-described structure, an aperture is not provided on the back side of the mounting substrate 10. Further, in the above-described structure, apertures provided on the front side of the mounting substrate 10 are located at positions different from the component mounting conductors 31 and 32.

According to this structure, solder does not enter the apertures, that is, the conductive holes. Hence, the above-described problem of voids does not occur. Thus, a highly reliable mounting substrate can be realized without increasing the size. Further, there is no need to adopt a shape such that the conductors are partly covered with the insulating film in order to cover the apertures. Hence, a decrease in the conductive area can be prevented without increasing the size, and degradation of electric characteristics can be prevented. Further, a decrease in a connection area between the external connection conductors and the solder can be prevented, and a decrease in connection strength can be prevented.

By mounting a mounted light emitting element, such as a light emitting diode, on the mounting substrate having this structure, a highly reliable light emitting device can be realized.

For example, this mounting substrate 10 is manufactured by the following procedure.

First, a base material 20 formed of silicon single crystal is prepared. Next, holes 511 and 512 are formed by, for example, dry etching. At this time, the holes 511 and 512 are formed such as not to reach a back surface of the base material 20.

Next, a plating seed layer is formed as a base for conductive films 521 and 522 and wiring conductors 71 and 72. For example, the plating seed layer is formed by a film obtained by sputtering titanium and copper in this order.

Next, the plating seed layer is patterned from the front side of the base material 20, for example, by photolithography to form a wiring conductor 71 including a projecting portion 711 and a wiring conductor 72 including a projecting portion 721. At this time, further copper film is preferably plated on surfaces of conductor films 521 and 522.

Next, an insulating layer 60 and insulating films 531 and 532 are formed from the front side of the base material 20, that is, from the side where the wiring conductors 71 and 72 are formed. For example, the insulating layer 60 and the insulating films 531 and 532 are formed by an insulating film, such as polyimide, having flexibility and thermoplasticity.

Next, a plating seed layer serving as a base for component mounting conductors 31 and 32 is formed on the surface of the insulating layer 60 by sputtering. Next, the plating seed layer is patterned from the front side of the base material 20, for example, by photolithography to form component mounting conductors 31 and 32. Further, plating of copper, nickel, and gold is selectively grown by using the component mounting conductors 31 and 32 as forming areas to complete the component mounting conductors 31 and 32.

Next, the back side of the base material 20 is ground using a grinder, CMP, and so on to expose the conductor films 521 and 522.

Next, a plating seed layer serving as a base for external connection conductors 41 and 42 is formed on the back surface of the base material 20 by sputtering. Next, the plating seed layer is patterned from the back side of the base material 20 by, for example, photolithography to form external connection conductors 41 and 42. Further, plating of copper, nickel, and gold is selectively grown by using the external connection conductors 41 and 42 as forming areas to complete the external connection conductors 41 and 42.

Figure 3:
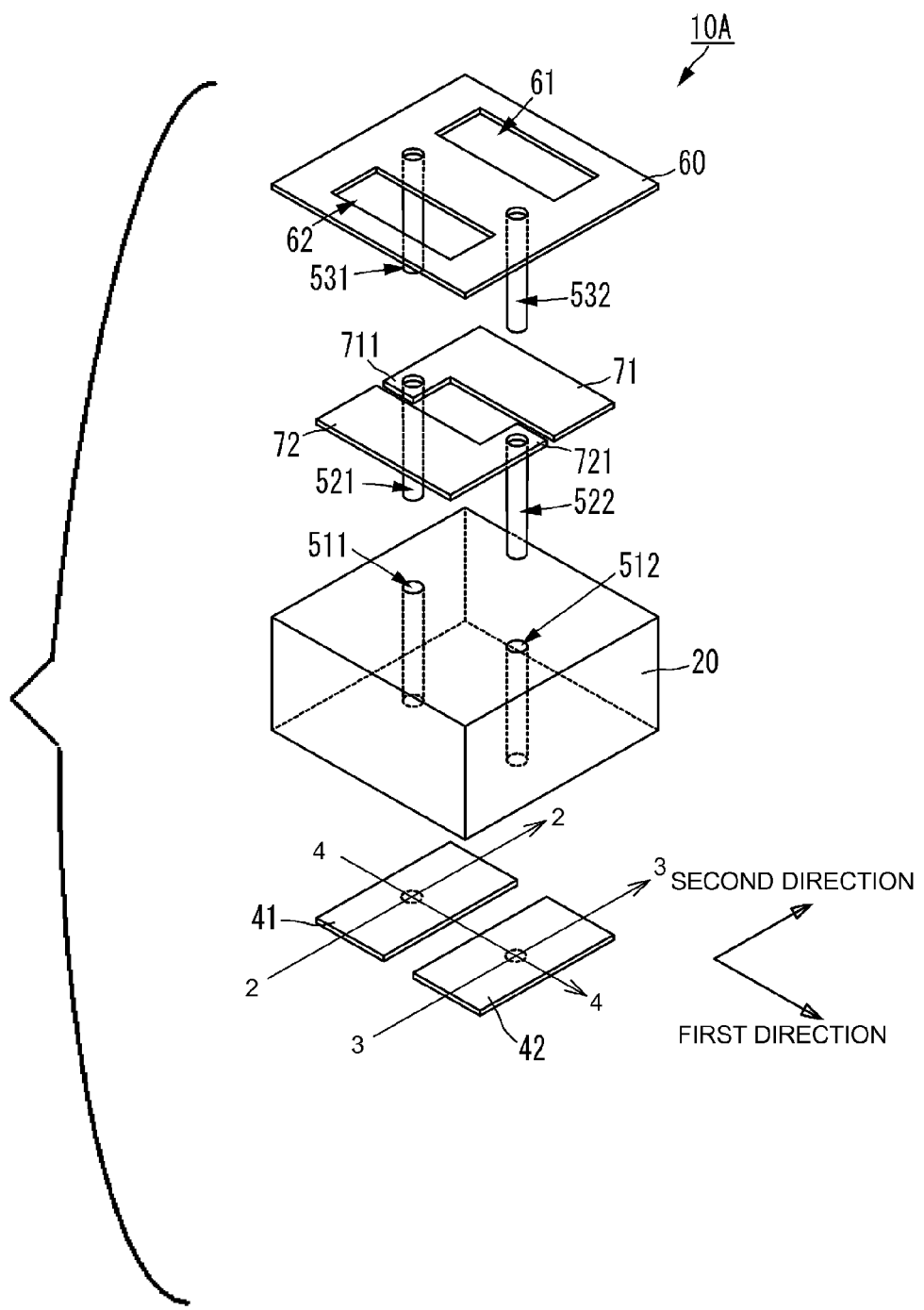
FIG. 3 is an exploded perspective view of a mounting substrate according to a second embodiment of the present disclosure.

Next, a mounting substrate according to a second embodiment will be described with reference to the drawing. FIG. 3 is an exploded perspective view of the mounting substrate according to the second embodiment of the present disclosure.

In a mounting substrate 10A of this embodiment, component mounting conductors 31 and 32 are omitted, in contrast to the mounting substrate 10 of the first embodiment. Other structures are the same. In the mounting substrate 10A, a portion of a wiring conductor 71 exposed from an aperture 61 and a portion of a wiring conductor 72 exposed from an aperture 62 also function as component mounting conductors.

In the second embodiment, apertures of holes 511 and 512 formed in a base material 20 are covered with an insulating layer 60.

According to this structure, since solder does not enter the apertures, that is, conductive holes, the above-described problem of voids does not occur. Thus, it is possible to realize a highly reliable mounting substrate without increasing the size. Further, it is possible to reduce the constituent elements of the mounting substrate. This can reduce the height and cost.

Figure 4:
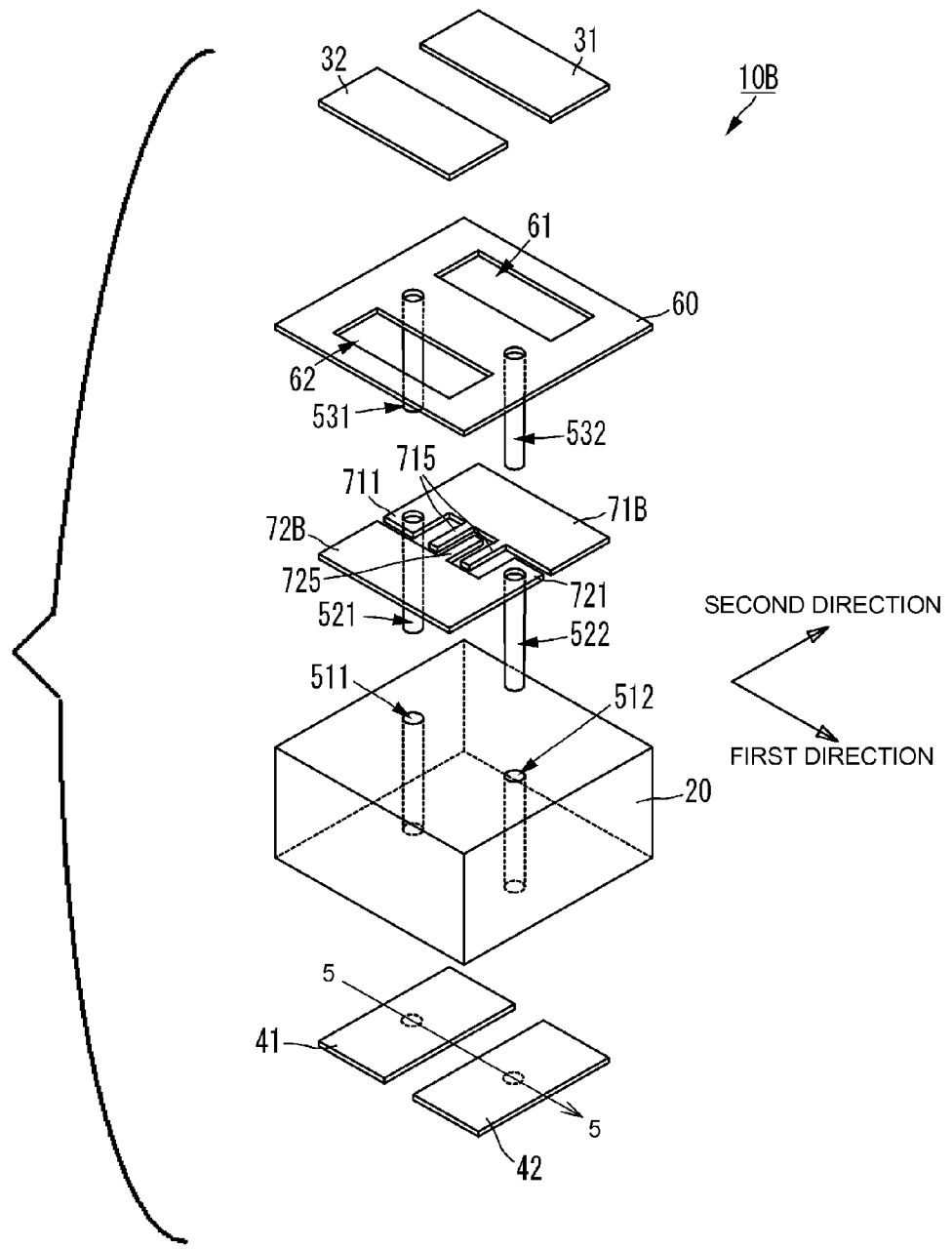
FIG. 4 is an exploded perspective view of a mounting substrate according to a third embodiment of the present disclosure.
Figure 5:
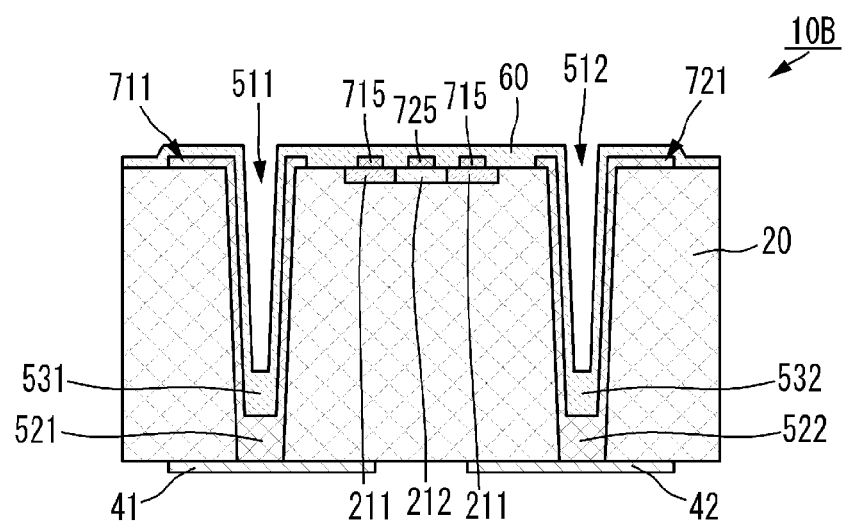
FIG. 5 is a cross-sectional view of the mounting substrate according to the third embodiment of the present disclosure.

Next, a mounting substrate according to a third embodiment will be described with reference to the drawings. FIG. 4 is an exploded perspective view of the mounting substrate according to the third embodiment of the present disclosure. FIG. 5 is a cross-sectional view of the mounting substrate according to the third embodiment of the present disclosure. FIG. 5 is a cross-sectional view illustrating a cross section taken along line 5-5 of FIG. 4.

In a mounting substrate 10B of this embodiment, comb-shaped conductors 715 and 725 are added, in contrast to the mounting substrate 10 of the first embodiment. Structures other than portions relevant to the comb-shaped conductors 715 and 725 for electrostatic discharging are the same as those of the mounting substrate 10 of the first embodiment.

A wiring conductor 71B is provided with the comb-shaped conductor 715. A wiring conductor 72B is provided with the comb-shaped conductor 725. The comb-shaped conductors 715 and 725 are provided in an area between the wiring conductors 71B and 72B. The comb-shaped conductors 715 and 725 are shaped to extend in the second direction, and are alternately arranged in the first direction at a predetermined distance from each other. The comb-shaped conductors 715 and 725 are provided in an area between projecting portions 711 and 721.

A front surface of a base material 20 on which the comb-shaped conductors 715 and 725 are formed is doped at a predetermined depth. At this time, a forming area 211 of the comb-shaped conductor 715 and a forming area 212 of the comb-shaped conductor 725 are doped with opposite semiconductor characteristics.

According to this structure, the forming portions of the comb-shaped conductors 715 and 725 serve as electrostatic discharging portions. Therefore, an ESD protecting function can be realized by the mounting substrate 10C. This can realize a more highly reliable mounting substrate.

Figure 6:
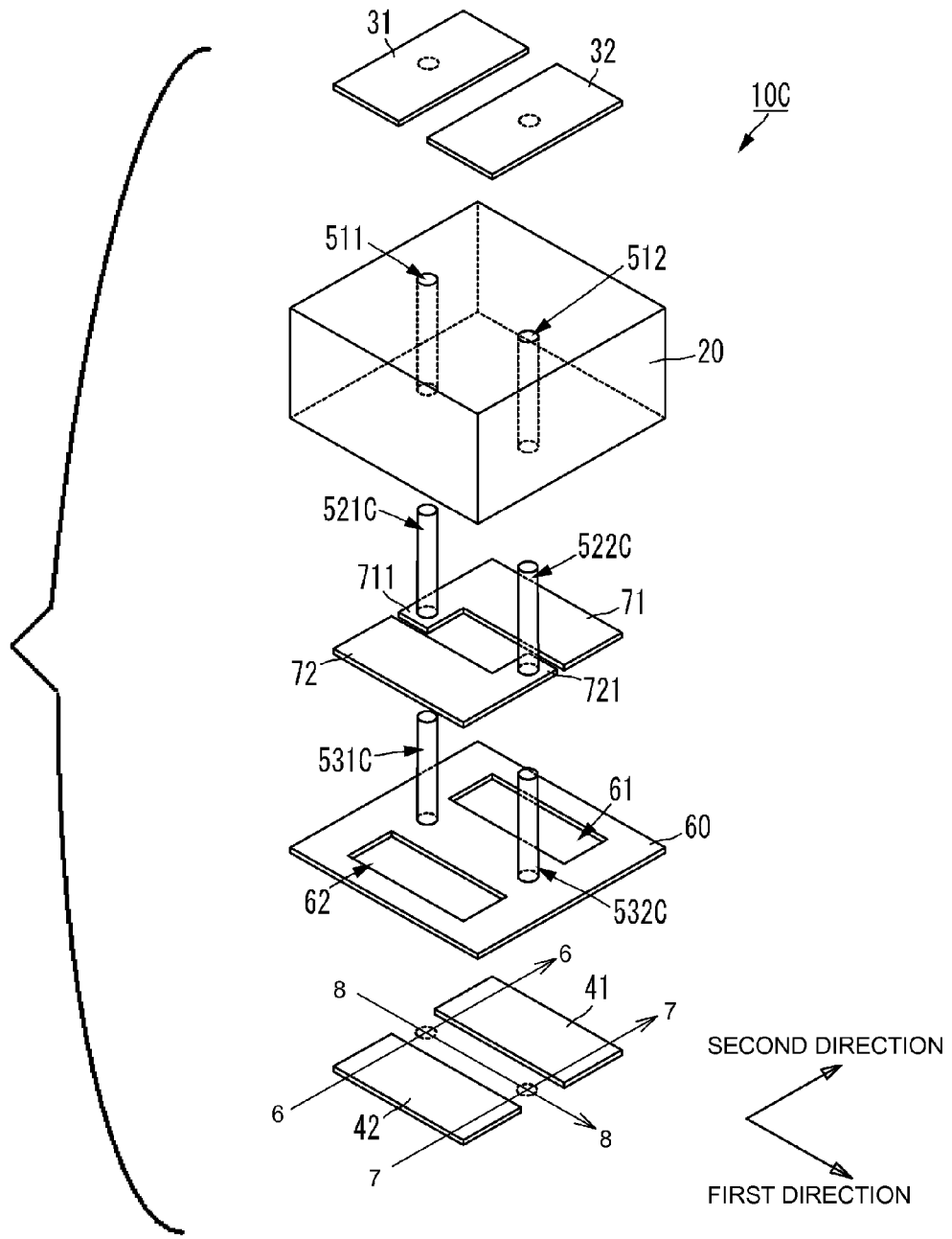
FIG. 6 is an exploded perspective view of a mounting substrate according to a fourth embodiment of the present disclosure.
Figure 7A:
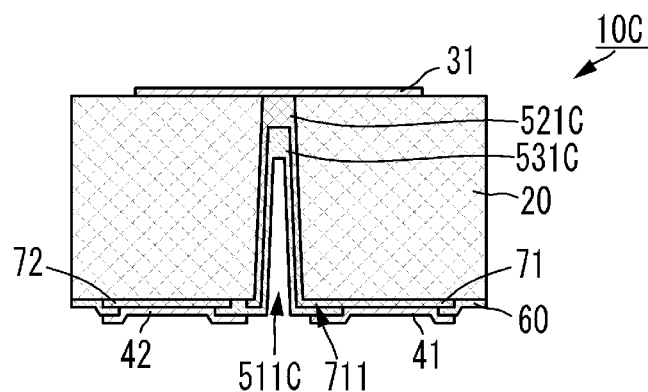
FIGS. 7(A), 7(B), and 7(C) include cross-sectional views of the mounting substrate according to the fourth embodiment of the present disclosure.
Figure 7B:
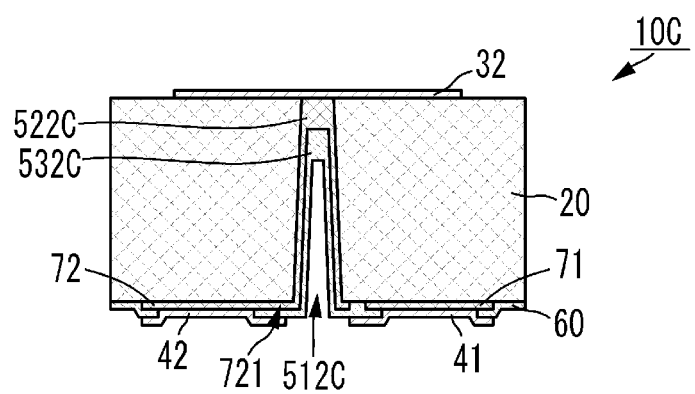
Figure 7C:
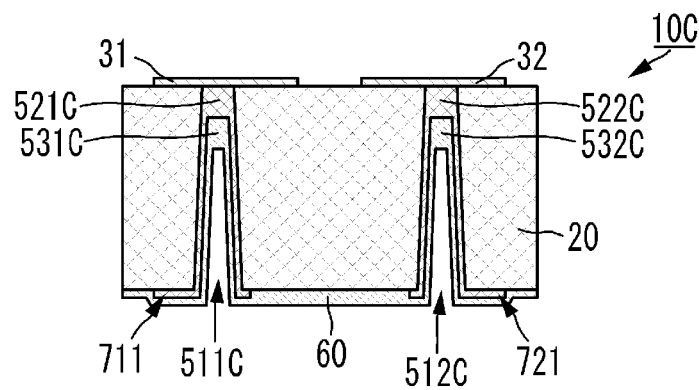

Next, a mounting substrate according to a fourth embodiment of the present disclosure will be described with reference to the drawings. FIG. 6 is an exploded perspective view of the mounting substrate according to the fourth embodiment of the present disclosure. FIG. 7 includes cross-sectional views of the mounting substrate according to the fourth embodiment of the present disclosure. The cross-sectional views of FIGS. 7(A), 7(B), and 7(C) show a cross section 6-6, a cross section 7-7, and a cross section 8-8 of FIG. 6, respectively.

Schematically, in a mounting substrate 10C of this embodiment, wiring conductors 71 and 72 and an insulating layer 60 are disposed on a back side of a base material 20, in contrast to the mounting substrate 10 of the first embodiment.

On a front surface of the base material 20, component mounting conductors 31 and 32 are provided. The component mounting conductors 31 and 32 are arranged in the first direction at a predetermined distance from each other. In plan view, the component mounting conductors 31 and 32 are each shaped like a rectangle that is long in the second direction and short in the first direction. The shape of the component mounting conductors 31 and 32 is not limited thereto.

On a back surface of the base material 20, wiring conductors 71 and 72 are provided. The wiring conductors 71 and 72 are substantially rectangular, and are arranged in the second direction at a predetermined distance from each other.

The wiring conductor 71 partly projects as a projecting portion 711 toward the wiring conductor 72. The wiring conductor 72 partly projects as a projecting portion 721 toward the wiring conductor 71. The projecting portion 711 and the projecting portion 721 are arranged in the first direction at a predetermined distance from each other. The projecting portion 711 is disposed to be superposed on the component mounting conductor 31 when the base material 20 is viewed in plan. The projecting portion 721 is disposed to be superposed on the component mounting conductor 32 when the base material 20 is viewed in plan.

An insulating layer 60 is provided on surfaces of the wiring conductors 71 and 72 opposite from the base material 20 (surfaces on the back side of the mounting substrate 10C).

The insulating layer 60 is shaped to cover the entire back surface of the base material 20. The insulating layer 60 is shaped to cover at least the projecting portions 711 and 721 of the wiring conductors 71 and 72, and is further shaped to cover a proximity portion between the projecting portion 711 and the wiring conductor 72 and a proximity portion between the projecting portion 721 and the wiring conductor 71. The insulating layer 60 has an aperture 61 in an area corresponding to a center area of the wiring conductor 71, and an aperture 62 in an area corresponding to a center area of the wiring conductor 72.

External connection conductors 41 and 42 are provided on a surface of the insulating layer 60 opposite from the base material 20 and the wiring conductors 71 and 72 (surface on the back side of the mounting substrate 10C).

The external connection conductors 41 and 42 are arranged in the second direction at a predetermined distance from each other. That is, the external connection conductors and 42 are arranged in a direction orthogonal to the arrangement direction of the component mounting conductors 31 and 32 when the mounting substrate 10C is viewed in plan. The external connection conductors 41 and 42 are each shaped like a rectangle that is long in the first direction and short in the second direction in plan view. The shape of the external connection conductors 41 and 42 is not limited thereto.

The external connection conductor 41 is in contact with the wiring conductor 71 via the aperture 61 of the insulating layer 60. The external connection conductor 42 is in contact with the wiring conductor 72 via the aperture 62 of the insulating layer 60.

According to this configuration, a structure is formed in which the component mounting conductors 31 and 32 are provided on the front side of the base material 20 and the external connection conductors 41 and 42 are provided on the back side of the base material 20.

The base material 20, the wiring conductor 71, and the insulating layer 60 have a hole 511 in a forming area of the projecting portion 711 of the wiring conductor 71. The hole 511 is shaped to penetrate the base material 20, the wiring conductor 71, and the insulating layer 60 in the thickness direction.

On an inner wall surface of the hole 511, a conductor film 521C is provided. The conductor film 521C is provided not only on the inner wall surface of the hole 511 provided in the base material 20, but also a surface where the hole 511 reaches the component mounting conductor 31. With this structure, the conductor film 521C is connected to the component mounting conductor 31. The conductor film 521C is connected to the projecting portion 711 of the wiring conductor 71.

An insulating film 531C is provided on a front surface of the conductor film 521C, that is, a surface opposite from a surface in contact with the base material 20 and the component mounting conductor 31. The insulating film 531C is physically connected to the insulating layer 60.

The base material 20, the wiring conductor 72, and the insulating layer 60 have a hole 512 in a forming area of the projecting portion 721 of the wiring conductor 72. The hole 512 is shaped to penetrate the base material 20, the wiring conductor 72, and the insulating layer 60 in the thickness direction.

On an inner wall surface of the hole 512, a conductor film 522C is provided. The conductor film 522C is provided not only on the inner wall surface of the hole 512 provided in the base material 20, but also on a surface where the hole 512 reaches the component mounting conductor 32. With this structure, the conductor film 522C is connected to the component mounting conductor 32. The conductor film 522C is connected to the projecting portion 721 of the wiring conductor 72.

An insulating film 532C is provided on a front surface of the conductor film 522C, that is, a surface opposite from a surface in contact with the base material 20 and the component mounting conductor 32. The insulating film 532C is physically connected to the insulating layer 60.

According to the above-described structure, the component mounting conductor 31 is electrically coupled to the external connection conductor 41 via the conductor film 521C of the hole 511, the projecting portion 711 of the wiring conductor 71, and the wiring conductor 71. Similarly, the component mounting conductor 32 is electrically coupled to the external connection conductor 42 via the conductor film 522C of the hole 512, the projecting portion 721 of the wiring conductor 72, and the wiring conductor 72.

In the above-described structure, an aperture is not provided on the front side of the mounting substrate 10C. Further, in the above-described structure, the apertures provided on the back side of the mounting substrate 10C are located at positions different from the external connection conductors 41 and 42.

According to this structure, solder does not enter the apertures, that is, the conductive holes. Hence, the above-described problem of voids does not occur. Thus, a highly reliable mounting substrate can be realized without increasing the size. Further, since there is no need to adopt a shape such that the insulating film covers parts of the conductors to cover the apertures, the decrease in conductive area can be prevented and deterioration of electric characteristics can be prevented without increasing the size.

Figure 8:
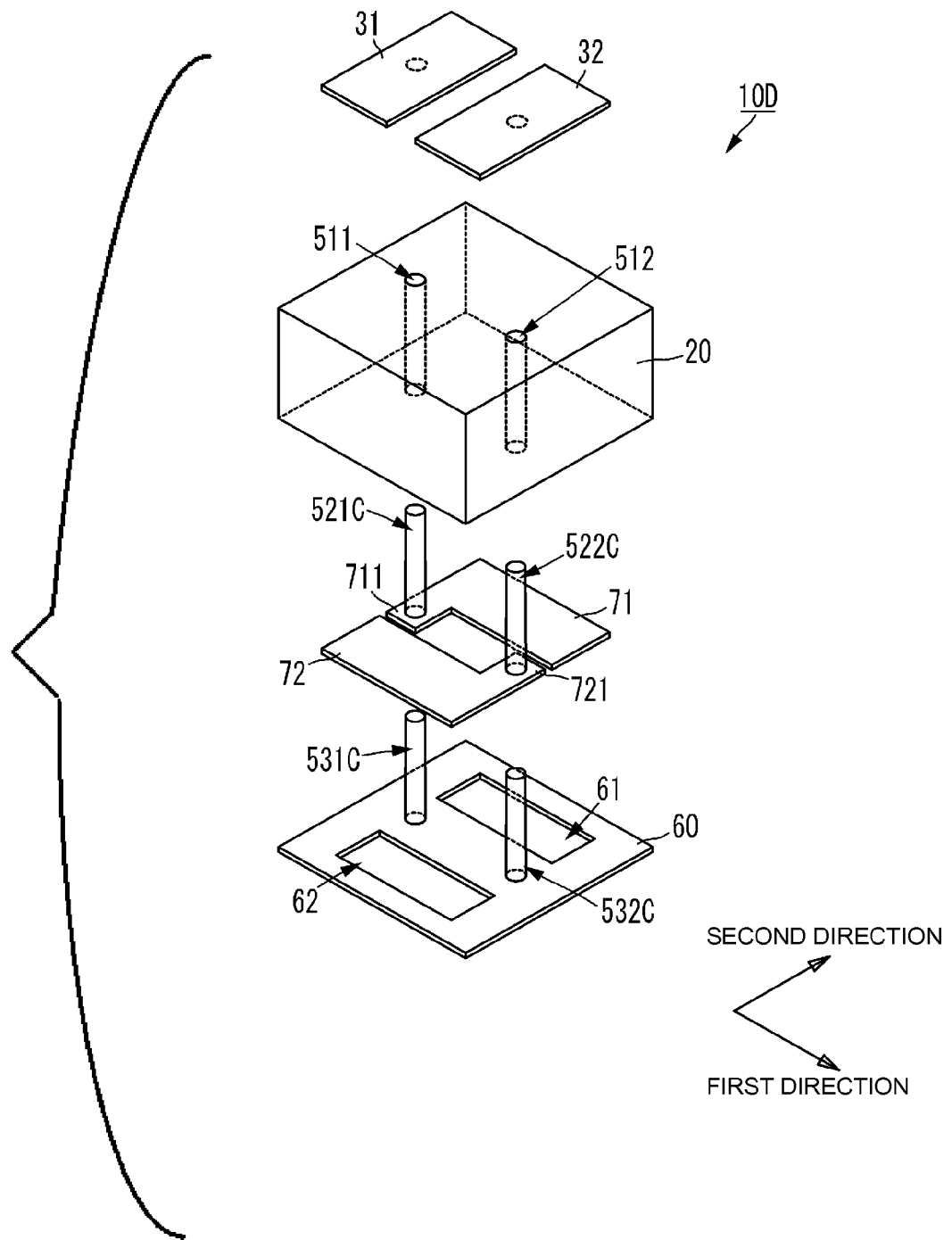
FIG. 8 is an exploded perspective view of a mounting substrate according to a fifth embodiment of the present disclosure.
Figure 9A:
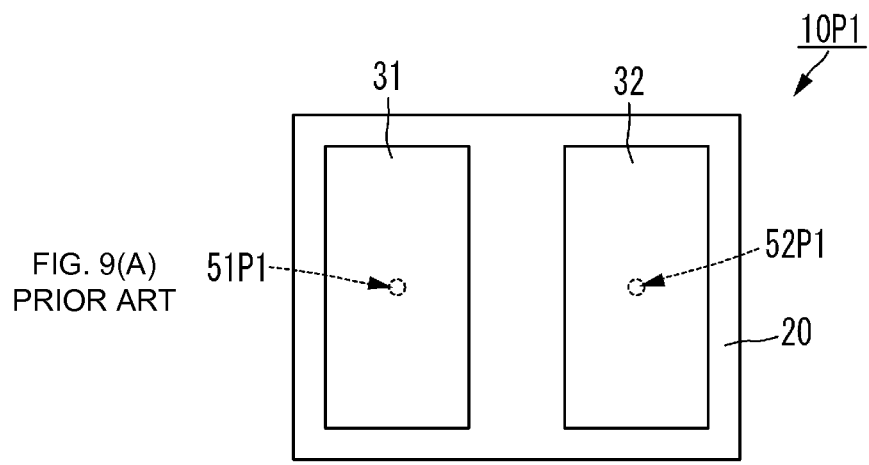
FIGS. 9(A), 9(B), and 9(C) show a front view, a sectional side view, and a rear view of an example of a mounting substrate of the related art.
Figure 9B:
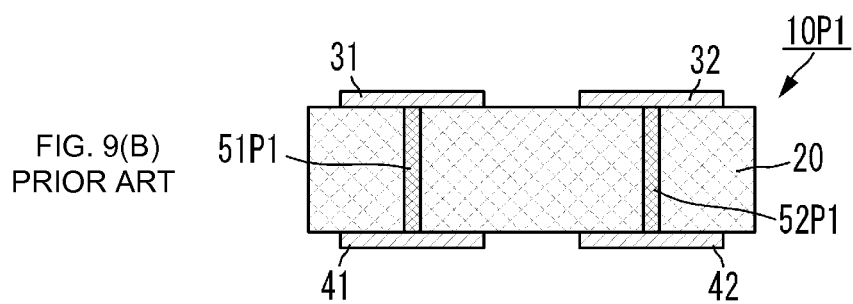
Figure 9C:
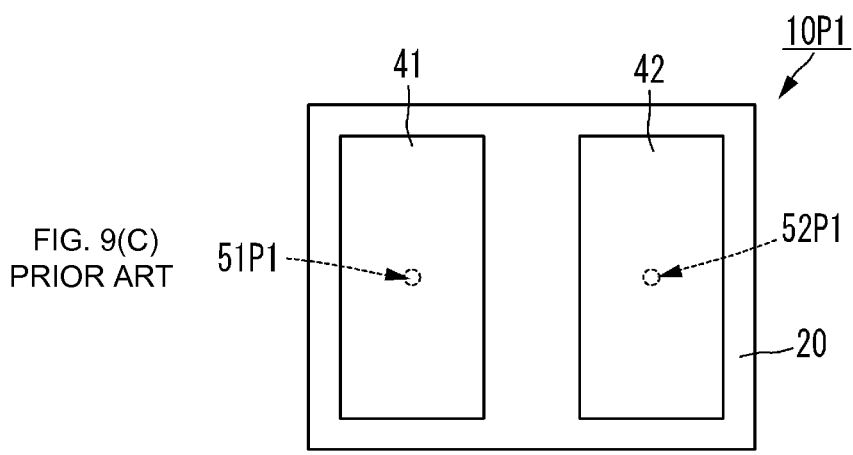
Figure 10A:
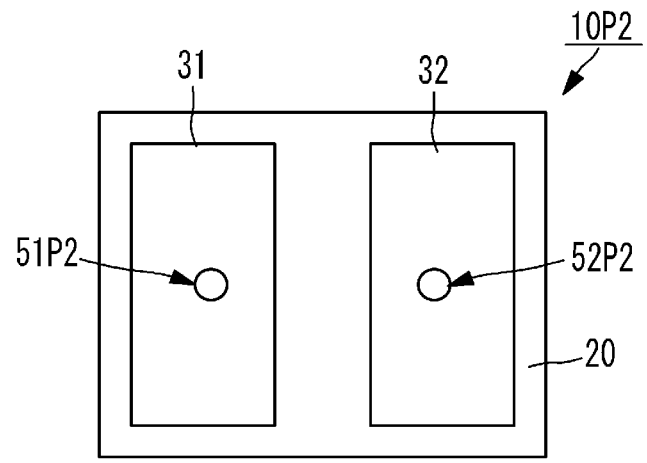
FIGS. 10(A), 10(B), and 10(C) include a front view, a sectional side view, and a rear view of another example of a mounting substrate of the related art.
Figure 10B:
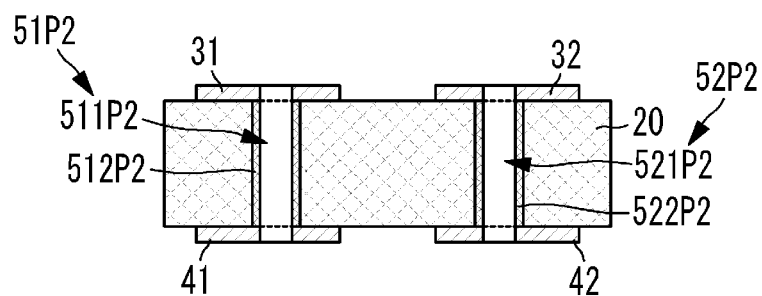
Figure 10C:
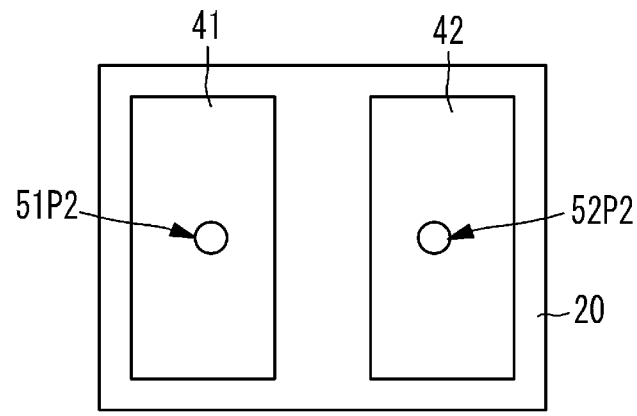
Figure 11A:
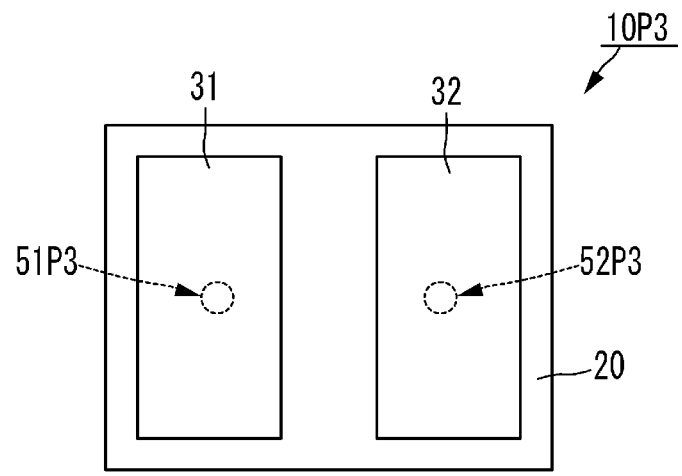
FIGS. 11(A), 11(B), and 11(C) include a front view, a sectional side view, and a rear view of a further example of a mounting substrate of the related art.
Figure 11B:
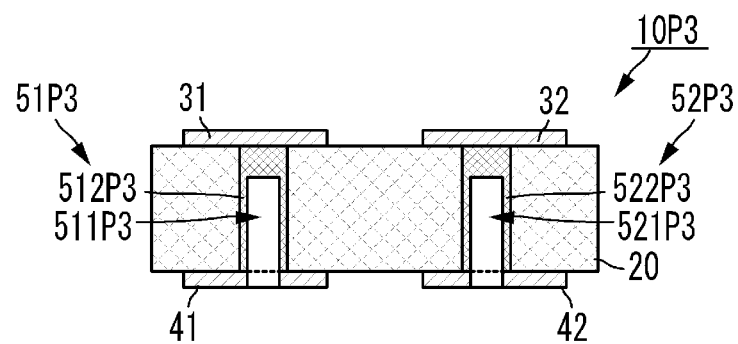
Figure 11C:
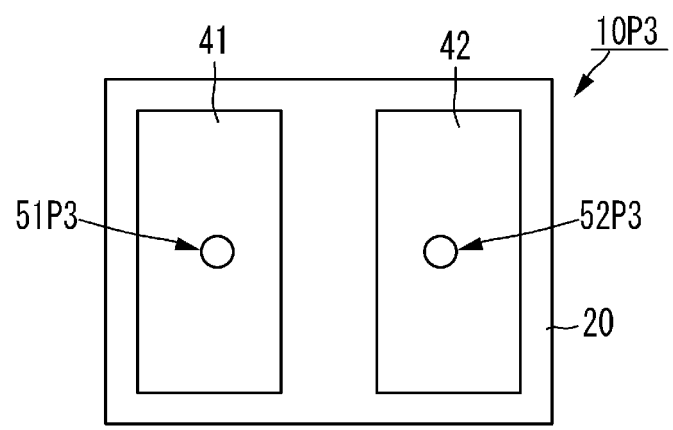
Figure 12:
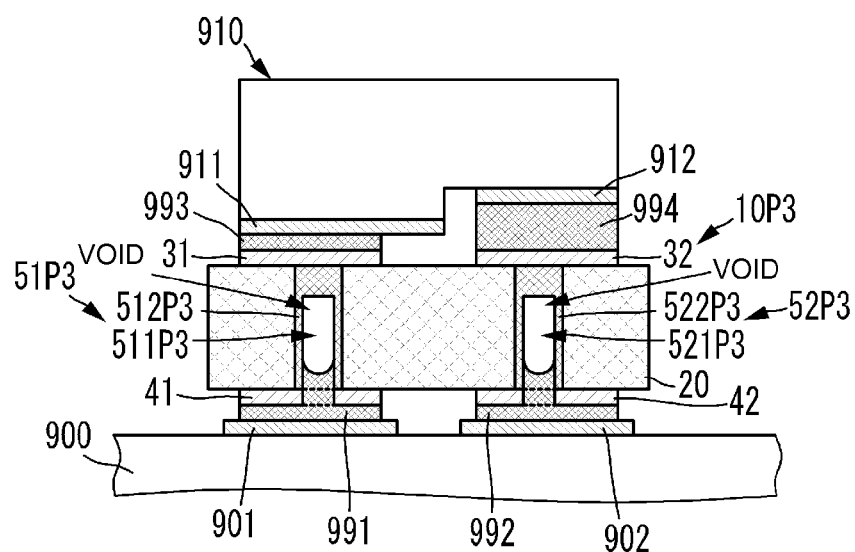
FIG. 12 is a side view illustrating a mounting manner using a mounting substrate 10P3 illustrated in FIG. 11.
Figure 13A:
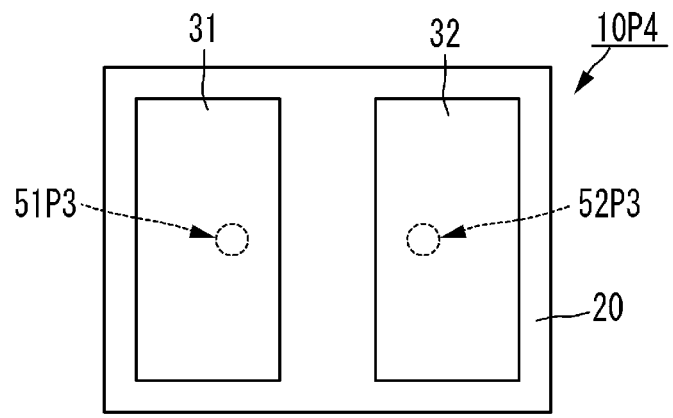
FIGS. 13(A), 13(B), and 13(C) include a front view and a back view of a mounting substrate 10P4 and a back view of a mounting substrate 10P5, illustrating structures in which apertures are closed.
Figure 13B:
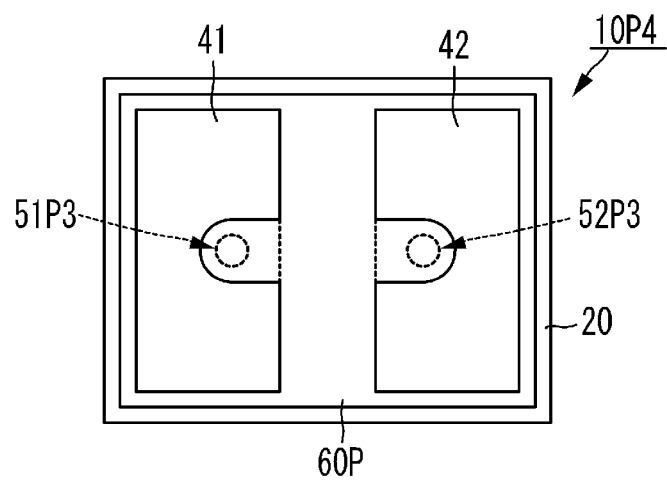
Figure 13C:
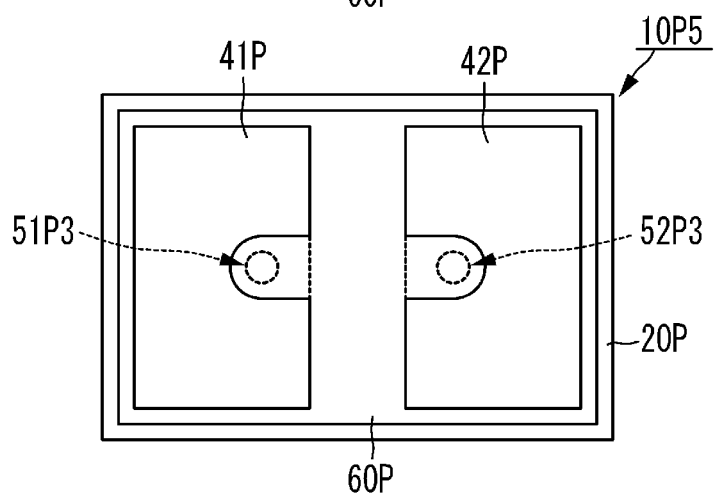

Next, a mounting substrate according to a fifth embodiment will be described with reference to the drawing. FIG. 8 is an exploded perspective view of the mounting substrate according to the fifth embodiment of the present disclosure.

In a mounting substrate 10D of this embodiment, external connection conductors 41 and 42 are omitted, in contrast to the mounting substrate 10C of the fourth embodiment. Other structures are the same. In the mounting substrate 10D, a portion of a wiring conductor 71 exposed from an aperture 61 and a portion of a wiring conductor 72 exposed from an aperture 62 also function as external connection conductors.

In the fifth embodiment, apertures of holes 511 and 512 provided in a base material 20 are covered with an insulating layer 60.

According to this structure, solder does not enter the apertures, that is, conductive holes. Hence, the above-described problem of voids does not occur. Thus, a highly reliable mounting substrate can be realized without increasing the size. Further, constituent elements of the mounting substrate can be reduced. This can reduce the height and cost.

While a specific type of the electronic component to be mounted using the mounting substrate is not particularly described above, the structure of the present disclosure is more effective for an element having low electrostatic resistance, for example, an LED element.

The invention claimed is:
1. A mounting substrate comprising:
a base material shaped like a flat plate having a first surface and a second surface opposed to the first surface;
first and second component mounting conductors provided at a distance from each other on the first surface of the base material;
first and second external connection conductors provided at a distance from each other on the second surface of the base material;
a first wiring conductor disposed between the first surface of the base material and the first component mounting conductor, and shaped such as to be in contact with the first component mounting conductor and such as to avoid contact with the second component mounting conductor,
a second wiring conductor disposed between the first surface and the second component mounting conductor, and shaped such as to be in contact with the second component mounting conductor and such as to avoid contact with the first component mounting conductor;
an insulating layer disposed between the first and second wiring conductors and the first and second component mounting conductors such that center areas of the first and second wiring conductors are exposed therefrom;
a first conductive hole open at one end between the first component mounting conductor and the second component mounting conductor on the first surface of the base material and being in contact at the other end with the first external connection electrode; and a second conductive hole open at one end between the first component mounting conductor and the second component mounting conductor on the first surface of the base material and being in contact at the other end with the second external connection electrode, wherein the first wiring conductor and the second wiring conductor partly project as projecting portions in a direction to approach each other, wherein the first conductive hole penetrates the projecting portion of the first wiring conductor, and wherein the second conductive hole penetrates the projecting portion of the second wiring conductor.

2. A mounting substrate comprising:

a base material shaped like a flat plate having a first surface and a second surface opposed to the first surface;

first and second wiring conductors provided at a distance from each other on the first surface of the base material;

first and second external connection conductors provided at a distance from each other on the second surface of the base material;

an insulating layer disposed on a side of the first and second wiring conductors opposite from the base material such that center areas of the first and second wiring conductors are exposed therefrom;

a first conductive hole open at one end between the first wiring conductor and the second wiring conductor on the first surface of the base material and being in contact at the other end with the first external connection electrode; and a second conductive hole open at one end between the first wiring conductor and the second wiring conductor on the first surface of the base material and being in contact at the other end with the second external connection electrode, wherein apertures at the open end of the first conductive hole and the second conductive hole are covered with the insulating layer, wherein the first wiring conductor and the second wiring conductor partly project as projecting portions in a direction to approach each other, wherein the first conductive hole penetrates the projecting portion of the first wiring conductor, and wherein the second conductive hole penetrates the projecting portion of the second wiring conductor.

3. A mounting substrate comprising:

a base material shaped like a flat plate having a first surface and a second surface opposed to the first surface;

first and second component mounting conductors provided at a distance from each other on the first surface of the base material;

first and second external connection conductors provided at a distance from each other on the second surface of the base material;

a first wiring conductor disposed between the second surface of the base material and the first external connection conductor, and shaped such as to be in contact with the first external connection conductor and such as to avoid contact with the second external connection conductor;

a second wiring conductor disposed between the second surface and the second external connection conductor, and shaped such as to be in contact with the second external connection conductor and such as to avoid contact with the first external connection conductor;

an insulating layer disposed between the first and second wiring conductors and the first and second external connection conductors such that center areas of the first and second wiring conductors are exposed therefrom;

a first conductive hole open at one end between the first external connection conductor and the second external connection conductor on the second surface of the base material, being in contact at the other end with the first component mounting electrode, and being connected to the first wiring electrode at an intermediate position between the one end and the other end; and a second conductive hole open at one end between the first external connection conductor and the second external connection conductor on the second surface of the base material, being in contact at the other end with the second component mounting electrode, and being connected to the second wiring conductor at an intermediate position between the one end and the other end, wherein the first wiring conductor and the second wiring conductor partly project as projecting portions in a direction to approach each other, wherein the first conductive hole penetrates the projecting portion of the first wiring conductor, and wherein the second conductive hole penetrates the projecting portion of the second wiring conductor.

4. A mounting substrate comprising:

a base material shaped like a flat plate having a first surface and a second surface opposed to the first surface;

first and second external connection conductors provided at a distance from each other on the first surface of the base material;

first and second wiring conductors provided at a distance from each other on the second surface of the base material;

an insulating layer disposed on a side of the first and second wiring conductors opposite from the base material such that center areas of the first and second wiring conductors are exposed therefrom;

a first conductive hole open at one end between the first wiring conductor and the second wiring conductor on the second surface of the base material and being in contact at the other end with the first external connection electrode; and a second conductive hole open at one end between the first wiring conductor and the second wiring conductor on the second surface of the base material and being in contact at the other end with the second external connection electrode, wherein apertures at the open end of the first conductive hole and the second conductive hole are covered with the insulating layer, wherein the first wiring conductor and the second wiring conductor partly project as projecting portions in a direction to approach each other;

wherein the first conductive hole penetrates the projecting portion of the first wiring conductor, and wherein the second conductive hole penetrates the projecting portion of the second wiring conductor.

5. The mounting substrate according to claim 1, wherein the first wiring conductor and the second wiring conductor have electrostatic discharging terminal conductors disposed at a predetermined distance from each other.

6. The mounting substrate according to claim 1, wherein the base material is formed of a silicon single crystal.

7. A light emitting device comprising:
the mounting substrate according to claim 1; and
a light emitting element mounted on the mounting substrate.

* * * * *